United States Patent [19]
Kobayashi

[11] Patent Number: 5,389,896
[45] Date of Patent: Feb. 14, 1995

[54] HBT MONOLITHIC VARIABLE GAIN AMPLIFIER WITH BIAS COMPENSATION AND BUFFERING

[75] Inventor: Kevin W. Kobayashi, Torrance, Calif.

[73] Assignee: TRW Inc., Redondo Beach, Calif.

[21] Appl. No.: 200,990

[22] Filed: Feb. 24, 1994

[51] Int. Cl.6 .............................................. H03G 3/12
[52] U.S. Cl. ...................................... 330/282; 330/283
[58] Field of Search ................... 330/85, 86, 282, 283, 330/285, 292, 103, 104

[56] References Cited

FOREIGN PATENT DOCUMENTS

| 1803655 | 6/1970 | Germany | 330/283 |
|---|---|---|---|
| 5259780 | 10/1993 | Japan | 330/282 |

*Primary Examiner*—Steven Mottola

[57] ABSTRACT

A variable gain amplifier is provided which includes a transistor amplifier having a first bipolar transistor with a base connected to an input for receiving an input signal. The first transistor has a collector coupled to an output. A parallel feedback path is connected between the collector and the base of the first transistor. A series feedback path is connected to an emitter of the first transistor. The series feedback path has a PIN diode which operates as a variable resistance element and receives a variable gain control signal so as to generate a variable gain. A bias compensation network is connected to the variable resistance element for generating a variable current source that provides current bias to the variable resistance element. In addition, a buffer transistor may be further coupled between the collector of the first transistor and the output to further enhance gain performance. The buffer transistor may be biased through a current source transistor.

20 Claims, 5 Drawing Sheets

HBT MONOLITHIC VARIABLE GAIN AMPLIFIER WITH BIAS COMPENSATION AND BUFFERING

BACKGROUND OF THE INVENTION

1. Technical Field

The present invention relates generally to transistor amplifiers and, more particularly, to a variable gain transistor amplifier which is capable of efficiently achieving high IP3 performance over a wide dynamic range.

2. Discussion

Modern commercial receiver applications such as those associated with global positioning satellites (GPS), high definition television (HDTV), cellular phone systems, and wireless local area network (LAN) systems increasingly require a wide input dynamic range as well as good intermodulation spur suppression. Systems such as these commonly operate within a frequency range of zero to 5.8 Gigahertz and require a large dynamic range due to varying signal strengths received from sources of various distances and locations. In addition, these systems also encompass high channel densities which require low intermodulation distortion.

In view of these and other requirements, there is an increasing need for high IP3 performance variable gain amplifiers which may adequately serve the needs of modern and future receiver applications. In the past, there have existed a number of conventional amplifiers that are capable of providing variable gain amplification. Generally, conventional variable gain amplifiers are typically constructed from a number of discrete transistors and PIN diodes. Typical variable gain amplifier circuits have included the use of bipolar transistor amplifiers such as a common-emitter transistor or a pair of Darlington-connected transistors with an input, output and feedback path. The feedback path usually receives a gain control signal for variably adjusting the amplification gain of the amplifier.

Variable gain amplifiers of the conventional type are capable of achieving variable gain amplification, but many of these approaches generally trade off performance and efficiency to achieve variable gain over a widened range. The conventional approaches usually fail to provide optimal compensation to the amplifier in an attempt to achieve enhanced IP3 performance, especially at high gain operations. As a consequence, the conventional amplifiers generally are not capable of efficiently achieving high IP3 performance while at the same time meeting the needs of a large input dynamic range.

It is therefore desirable to provide for a variable gain amplifier which may achieve high IP3 performance while maintaining a large dynamic gain control range. It is further desirable to provide for such a variable gain amplifier which provides for increased IP3 performance and gain while incurring a small increase in power dissipation. More specifically, it is desirable to provide for a variable gain amplifier with a PIN diode bias compensation network which enhances the amplifier performance, especially for higher gain states. Also, it is desirable to provide for an inexpensive self-biased variable gain amplifier circuit which employs heterojunction bipolar transistors on a monolithic chip.

SUMMARY OF THE INVENTION

In accordance with the teachings of the present invention, a variable gain amplifier is provided which includes an input for receiving an input signal and an output for providing an amplified output signal. A transistor amplifier is provided which has a first bipolar transistor with a base connected to the input, a collector coupled to the output, and an emitter. A parallel feedback path is connected between the collector and base of the first transistor. A series feedback path is connected to the emitter of the first transistor. The series feedback path includes a variable resistance element and receives a variable gain control signal for controlling gain of the amplifier. A bias compensation network is connected to the variable resistance element for providing a current bias thereto. In addition, a buffer transistor may further be coupled between the collector of the transistor amplifier and the output.

BRIEF DESCRIPTION OF THE DRAWINGS

Other objects and advantages of the present invention will become apparent to those skilled in the art upon reading the following detailed description and upon reference to the drawings in which.

DETAILED DESCRIPTION OF THE PREFERRED EMBODIMENT

Figure 1:
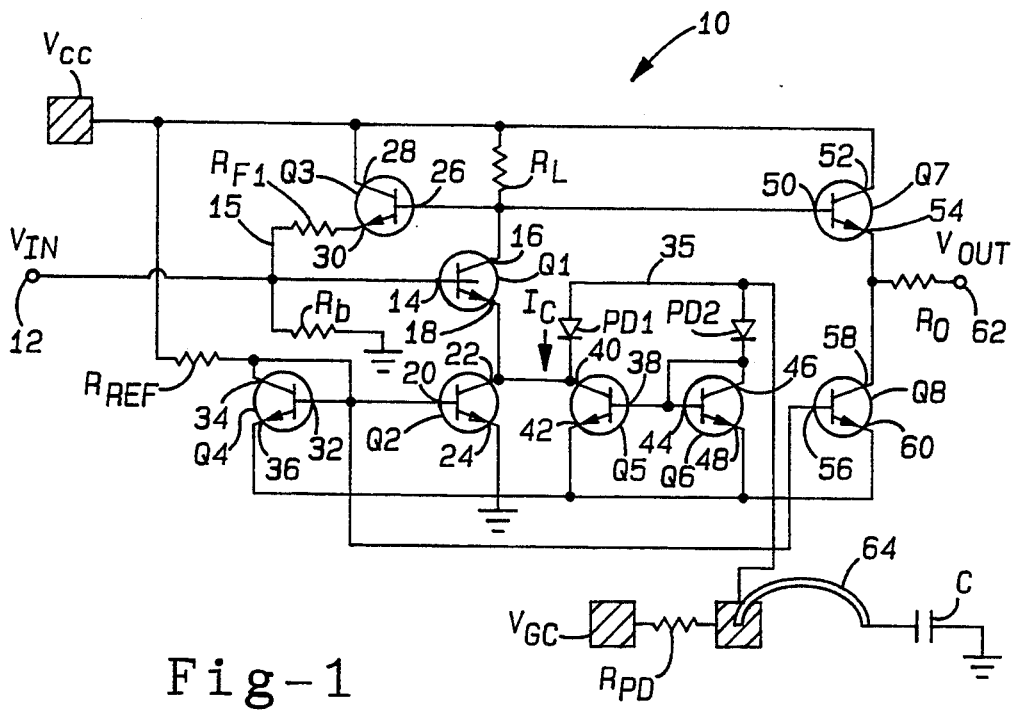
FIG. 1 is a circuit diagram of a variable gain amplifier employing a bias compensation and buffer transistor topology in accordance with the present invention.

Turning now to FIG. 1, a variable gain amplifier 10 is shown configured in a circuit arrangement according to the present invention. The variable gain amplifier 10 has a first heterojunction bipolar transistor (HBT) Q1 that is configured as a common-emitter transistor amplifier. The bipolar transistor Q1 has a base 14, a collector 16 and an emitter 18. The base 14 of transistor Q1 is connected to an input terminal 12 for receiving an input voltage signal $V_{IN}$, while an amplified signal is generated at the collector 16 as a function of amplifier gain.

The amplifier 10 has a first feedback resistor $R_{F1}$ and an emitter-follower transistor Q3 connected between the collector 16 and the base 14 of transistor Q1 to form a parallel feedback path 15. Transistor Q3 has a base 26 connected to the collector 16 of transistor Q1, an emitter 30 connected to resistor $R_{F1}$ and a collector 28 connected to a five volt power supply $V_{cc}$. First feedback resistor $R_{F1}$ has a resistance that is selected so as to fix the maximum gain value as well as input return-loss performance. Transistor Q3 buffers the collector 16 of transistor Q1 from a low impedance parallel feedback. This helps to ensure the existence of a high impedance at the collector 16 of transistor Q1 which further enhances IP3 performance of amplifier 10. IP3 performance is referred to herein and known to those in the art as the intercept point of two lines which represent the fundamental output power characteristics and the third order intermodulation spur output power characteristics both versus input power, and which give an indication of amplifier intermodulation distortion.

A bias resistor $R_b$ is connected between the base 14 of transistor Q1 and ground. Bias resistor $R_b$ essentially completes the parallel feedback path 15 and provides a DC bias to the base 14 of transistor Q1.

The amplifier 10 is self-biased through the five volt power supply $V_{cc}$. A load resistor $R_L$ is connected between the power supply $V_{cc}$ and the collector 16 of transistor Q1. Load resistor $R_L$ is referred to as a collector load resistor which has a resistance that helps to determine the gain provided by transistor Q1.

A fixed current mirror bias is provided for transistor Q1 and includes transistors Q2 and Q4 which have respective bases 20 and 32 connected together. Transistor Q2 has a collector 22 connected to the emitter 18 of transistor Q1. Transistor Q4 has a collector 34 connected to the five volt power supply $V_{cc}$ via a reference resistor $R_{ref}$. Transistors Q2 and Q4 have respective emitters 24 and 36 connected to ground. The fixed current mirror bias effectively sources a fixed bias current for transistor Q1.

The amplifier 10 of the present invention further includes a series feedback path 35 which has a PIN diode PD1 with a cathode thereof connected to the emitter 18 of transistor Q1 and an anode connected to a variable gain control voltage $V_{GC}$ via a series bias resistor $R_{PD}$. The PIN diode PD1 is a variable resistance element which provides a variable resistance in response to the transmission of a variable current $I_c$ therethrough. The series feedback path 35 further connects the emitter 18 of transistor Q1 to an AC ground through an off-chip capacitor C. The control voltage $V_{GC}$ is used to change the current $I_c$ flowing through the PIN diode PD1. This in turn causes a change in bias through diode PD1 which effectively changes the series resistance of the diode PD1. As a consequence, the series resistance feedback element can be electronically controlled by way of the gain control voltage $V_{GC}$ and the gain of the amplifier 10 may be adjusted accordingly.

The amplifier 10 also includes a PIN diode bias compensation network made up of a second PIN diode PD2 and a pair of transistors Q5 and Q6. Transistors Q5 and Q6 each have respective bases 38 and 44 directly connected together and emitters 42 and 48 both connected to ground. Transistor Q5 has a collector 40 connected to the cathode of the first PIN diode PD1. Transistor Q6 has a collector 46 which is coupled to the cathode of the second PIN diode PD2 and further connected to the base 44 of transistor Q6. The PIN diode PD2 has an anode connected to the anode of the first PIN diode PD1 and is therefore in parallel with the series feedback path 35. The second PIN diode PD2 transmits a mirror current therethrough so as to sink the current $I_c$ of diode PD1 without disturbing fixed current source bias of transistor Q1. Accordingly, the PIN diode bias compensation network sets up a variable current source which provides a current bias for the first PIN diode PD1.

Transconductance and IP3 performance is strongly dependent on bias current provided to transistor Q1. Without the above-described bias scheme, the current bias of pin diode PD1 will be subtracted from the nominal bias current of transistor Q1 as the control voltage $V_{GC}$ is increased. The decrease of the quiescent bias current of transistor Q1 will typically adversely affect the gain and IP3 performance of the variable gain amplifier 10 at higher gain states. Accordingly, the inclusion of the bias compensation network with the added variable voltage controlled current source $I_{cc}$ operates to effectively sink the desired current of PIN diode PD1 without disturbing the fixed current bias of transistor Q1.

The amplifier 10 further includes an emitter follower output buffer transistor Q7 which has a base 50 connected to the collector 16 of transistor Q1. Transistor Q7 has a collector 52 connected to the power supply $V_{cc}$. Transistor Q7 also has an emitter 54 connected to an output terminal 62 via an output resistor $R_o$. The emitter-follower output buffer transistor Q7 buffers high impedances at the collector 16 of transistor Q1 from the output terminal 62. This allows for realization of an enhanced amplified output signal $V_{out}$ over a variable gain control range.

In addition, a current source transistor Q8 is provided for biasing transistor Q7. Transistor Q8 includes a base 56 that is connected to the current mirror via respective bases 20 and 32 of transistors Q2 and Q4. Accordingly, base 56 is coupled to the five volt power supply $V_{cc}$ via reference resistor $R_{ref}$. Transistor Q8 also includes an emitter 60 coupled to ground and a collector 58 directly connected to the emitter 54 of transistor Q7. The collector 58 of transistor Q8 effectively provides a bias to the emitter 54 of transistor Q7.

The operation of variable gain amplifier 10 will now be described with reference to FIGS. 2 through 9 in accordance with one example of the present invention. The example employed to achieve the performance data illustrated in FIGS. 2 through 9 includes a five volt supply $V_{cc}$, load resistor $R_L$ equal to 88 ohms, output resistor $R_o$ equal to 30 ohms, reference resistor $R_{REF}$ equal to 1.4 kiloohms, feedback resistor $R_{F1}$ equal to 750 ohms, bias resistor $R_b$ equal to 1.4 kiloohms and resistor $R_{PD}$ equal to 220 ohms. Transistors Q1 through Q8 are four finger devices which according to the present example may have a preferred length and width of 2 μm by 10 μm per finger as determined by the required amplifier linearity requirements. Larger transistors and currents are required for higher linearity variable gain amplifiers. Feedback resistor $R_{F1}$ is selected to fix the maximum gain value of amplifier 10 as well as input return-loss performance. Accordingly, resistor $R_{F1}$ is preselected to achieve optimum performance for a given application.

In operation, an input voltage $V_{IN}$ is applied to input terminal 12 and directly transmitted to the base 14 of transistor Q1. Bipolar transistor Q1 generates an amplified output at the collector 16 thereof which is buffered by transistor Q7 via an output resistor $R_o$ and supplied as an output $V_{OUT}$ at output terminal 62. In doing so, the amplification gain generated by transistor Q1 may be controlled by a variable control signal as shown by variable gain control voltage $V_{GC}$. The variable gain control voltage $V_{GC}$ may be generated by an electronic control device. The variable gain control voltage $V_{GC}$ is transmitted through resistor $R_{PD}$ and PIN diodes PD1 and PD2. PIN diode PD1 provides a variable resistance in response to current $I_c$ flowing therethrough and operates to effectively change the amplifier gain. The second PIN diode PD2 effectively provides a mirror current which operates as a bias to PIN diode PD1. In addition, buffer transistor Q7 further enhances performance exhibited by the output voltage $V_{OUT}$.

Figure 2:
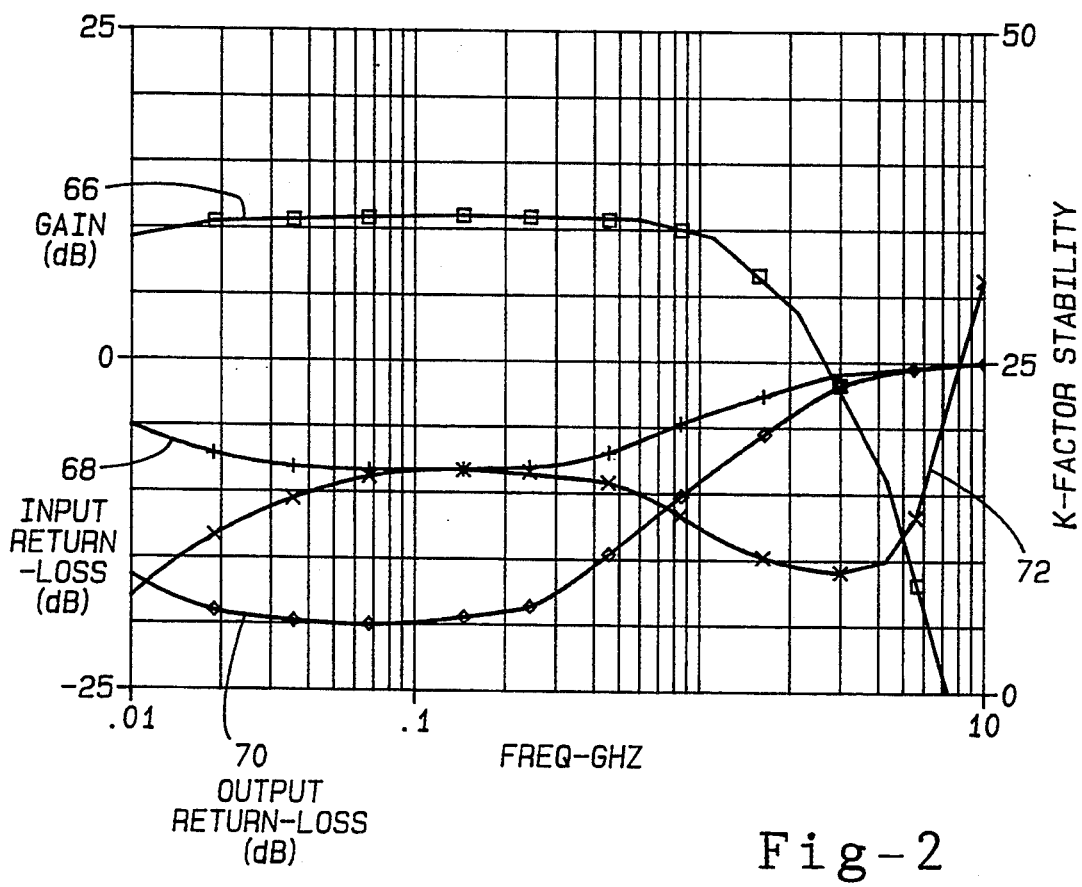
FIG. 2 is a graph which illustrates gain, return loss and stability performance achieved at maximum gain with one example of the variable gain amplifier.
Figure 3:
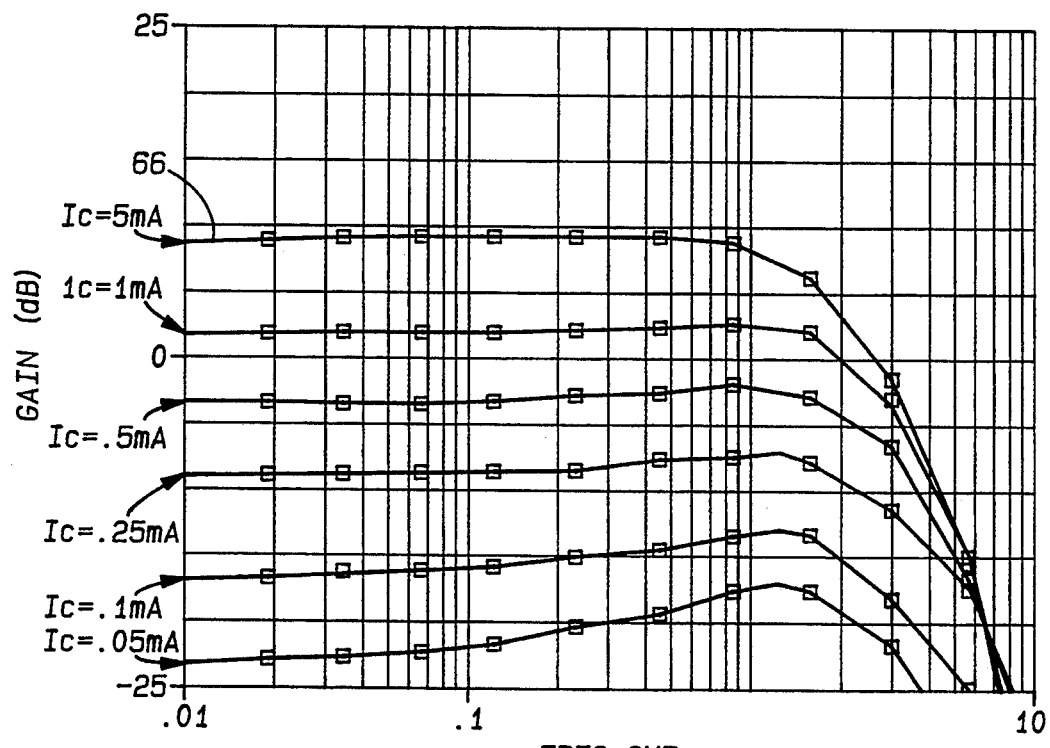
FIG. 3 is a graph which illustrates gain response as a function of a control current through a PIN diode that may be achieved with the variable gain amplifier.
Figure 4:
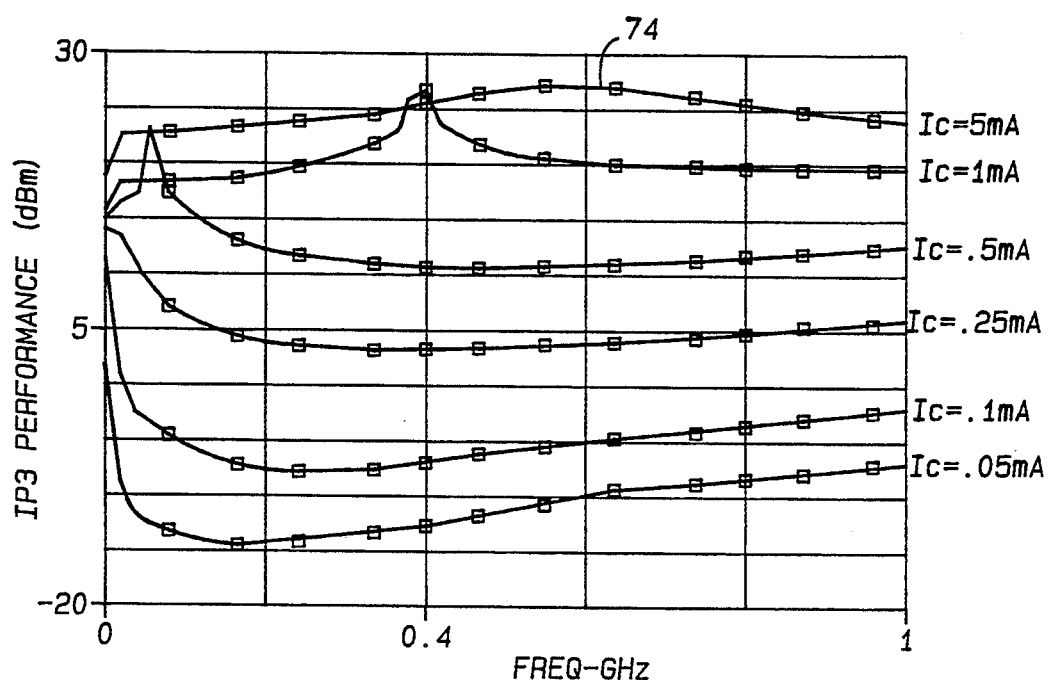
FIG. 4 is a graph which shows two-tone IP3 performance as a function of the control current achieved with the variable gain amplifier.

Referring to FIG. 2, gain 66, input return-loss 68, output return loss 70, and stability performance 72, is plotted for one example of the variable gain amplifier 10 while set at the maximum gain state. At maximum gain, the above example exhibits a 3 dB frequency cutoff of approximately 1.4 GHz. The gain 66 may be varied by controlling the variable gain control voltage $V_{GC}$ so as to control the current $I_c$ through PIN diode PD1. As shown in FIG. 3, the control current $I_c$ may be varied from between 5 mA to 0.05 mA, for example, while exhibiting substantially smooth gain performance 66 at variable amounts of gain as selected by controlling current $I_c$. Two-tone IP3 performance 74 is shown in FIG. 4 for the same control current $I_c$ variations from between 5 mA to 0.05 mA.

Figure 5:
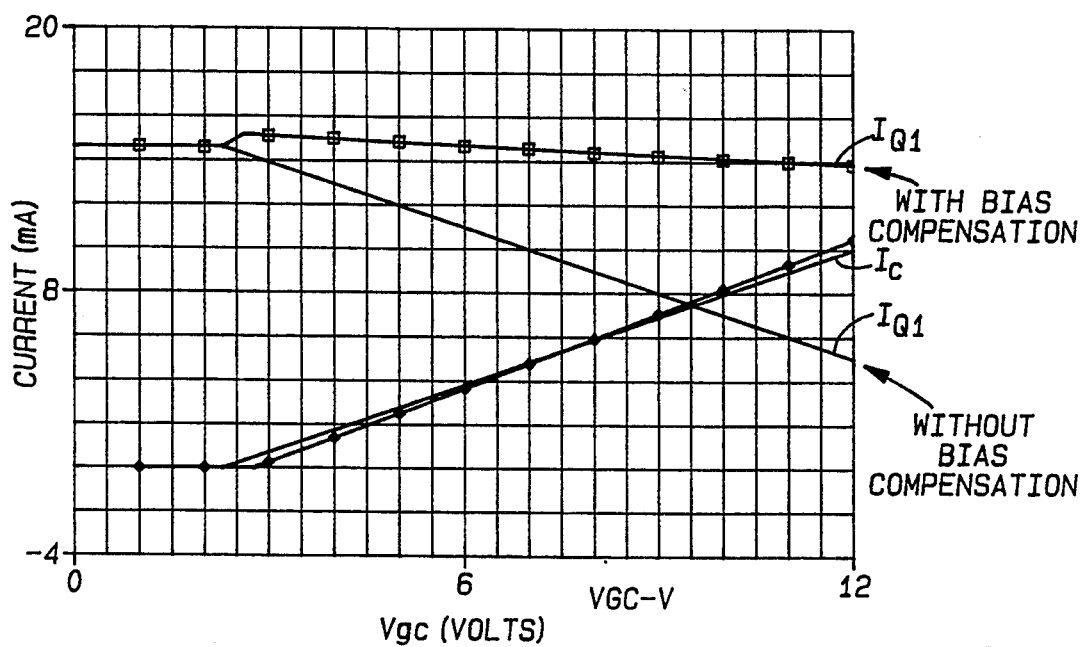
FIG. 5 is a graph which compares transistor current exhibited by an amplifier without bias compensation and transistor current exhibited by the variable gain amplifier with bias compensation.
Figure 6:
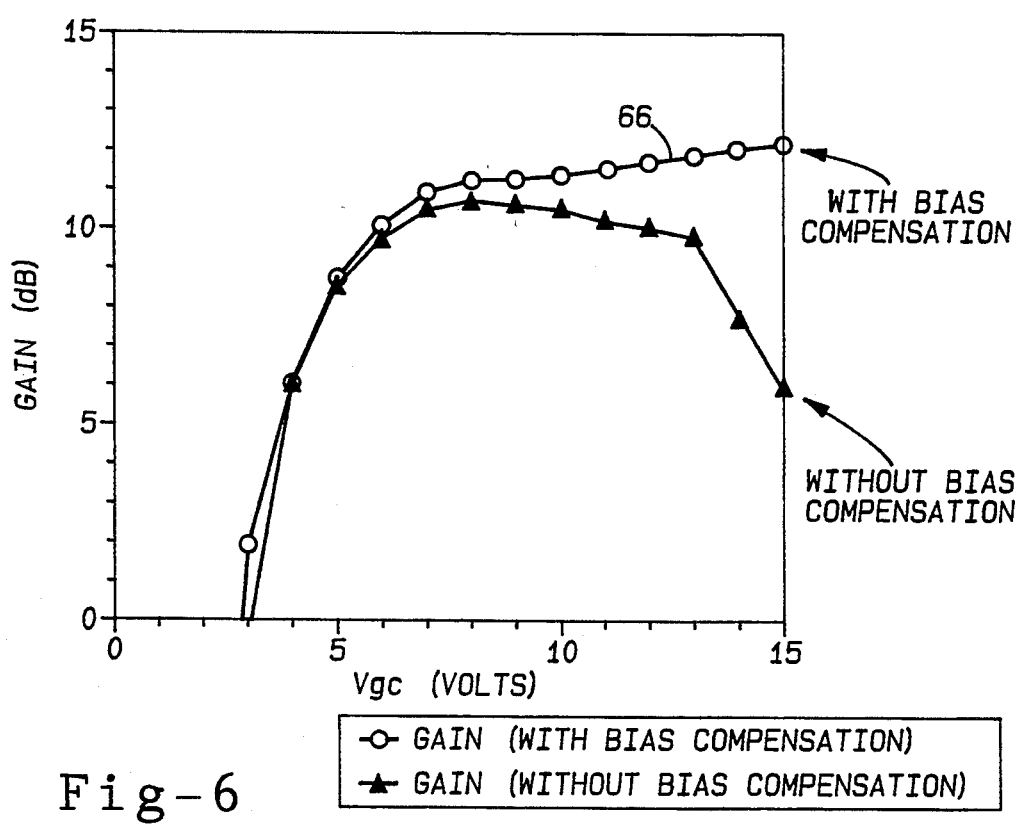
FIG. 6 is a graph which compares gain as a function of a variable gain control voltage exhibited by an amplifier both with and without the bias compensation.
Figure 7:
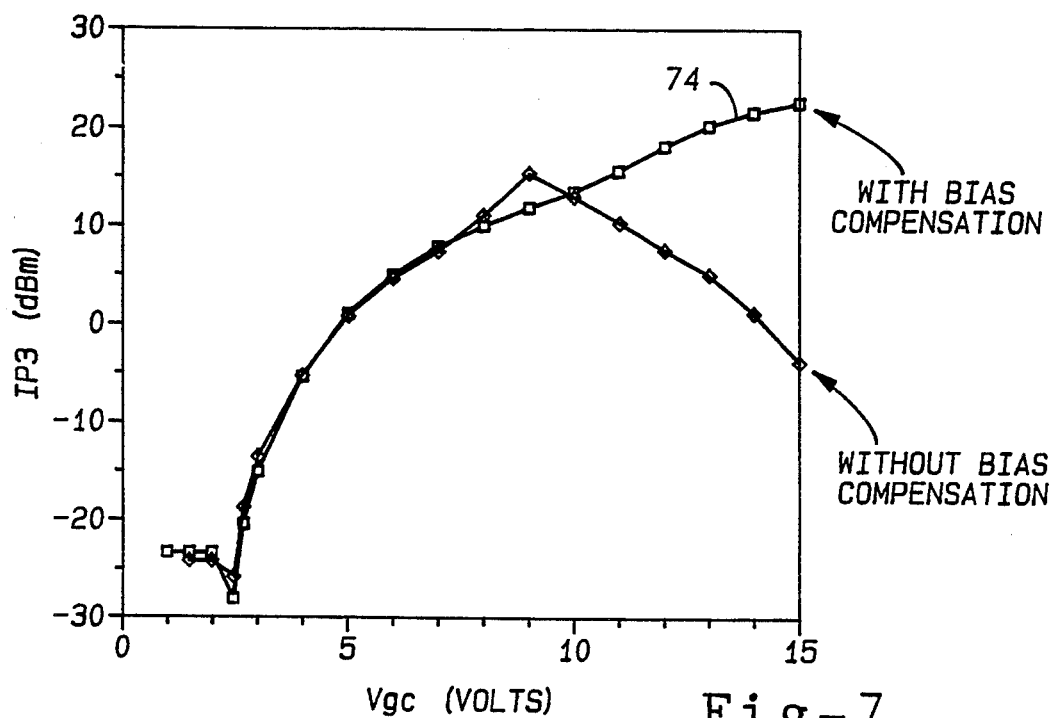
FIG. 7 is a graph which compares IP3 performance as function of the variable gain control voltage for an amplifier both with and without the bias compensation.

Turning to FIGS. 5 through 7, amplifier performance characteristics are shown which illustrate the improvement provided by the bias compensation network in accordance with the present invention. Transistor current $I_{Q1}$ which is the current flowing from the collector 16 to the emitter 18 of transistor Q1 shows a degrading performance without bias compensation for increased control voltage $V_{GC}$. With the bias compensation provided herein, the transistor current $I_{Q1}$ provides a much improved current with a more constant amplitude. The improvement in gain 66 with the addition of the bias compensation is further illustrated in FIG. 6. It is shown that the gain 66 continues to increase for high gain voltages so as to extend the dynamic range of amplifier 10. The addition of the bias compensation is further illustrated by the IP3 performance 74 illustrated in FIG. 7.

Figure 8:
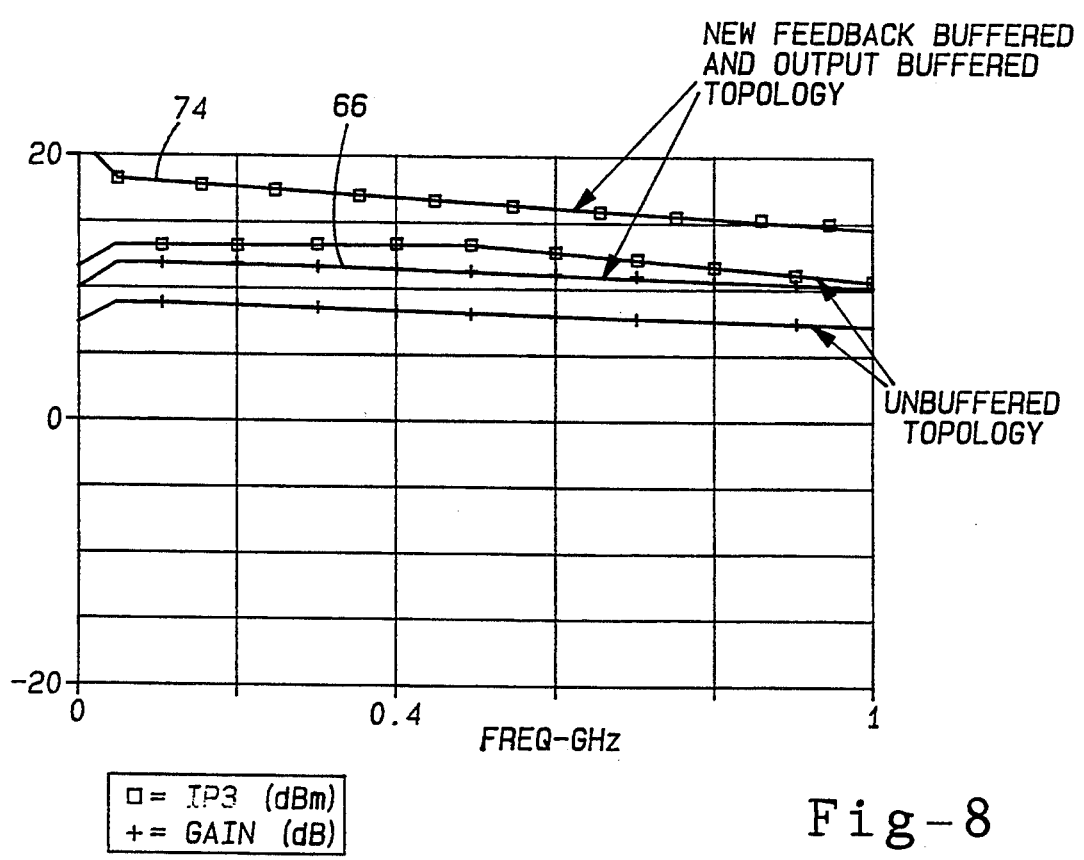
FIG. 8 is a graph which shows comparisons of gain and IP3 performance with and without the use of a transistor buffer for the variable gain amplifier.

With particular reference to FIG. 8, the addition of the feedback buffered and output buffered topology presented herein is shown in contrast to an unbuffered topology. This is shown with both gain 66 and IP3 performance 74. According to this example, the addition of the feedback buffered and output buffered topology provides at least a 5 dB improvement in IP3 performance 74, while at the same time requiring less than a doubling of additional current due to the addition of transistors Q3 and Q7.

Figure 9:
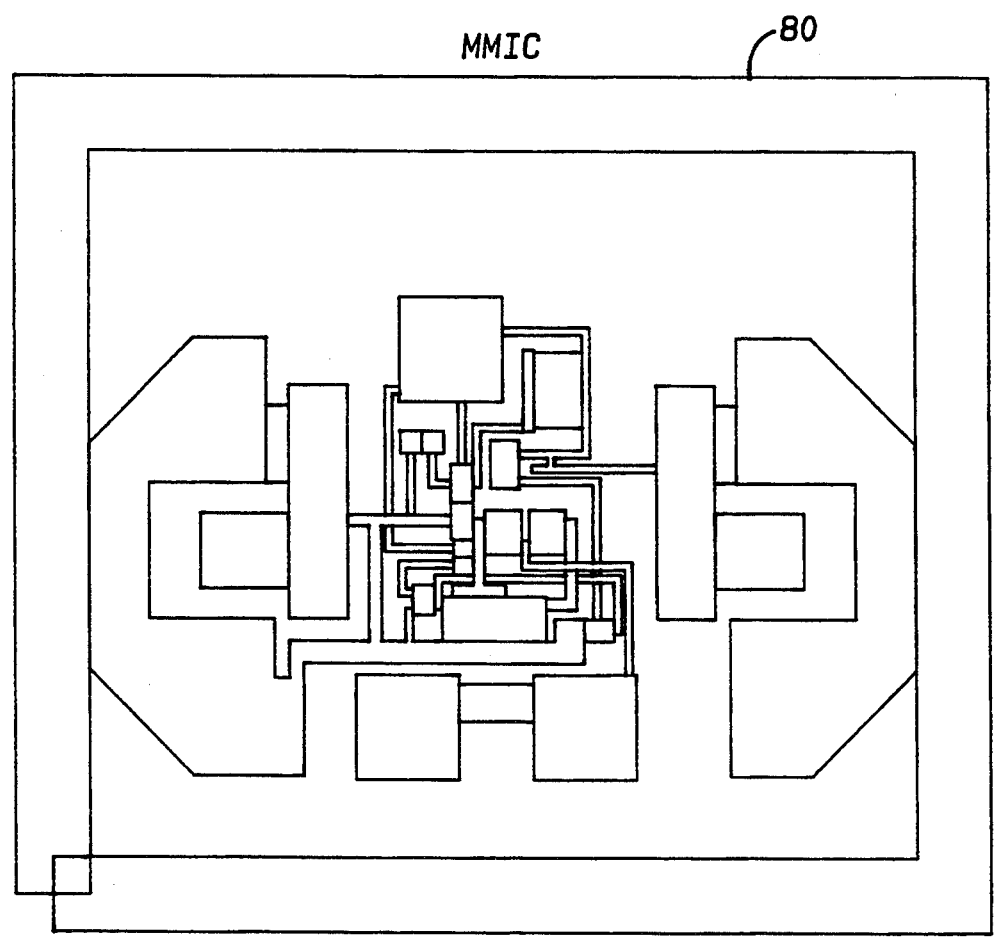
FIG. 9 is a chip layout of the variable gain amplifier formed on a monolithic microwave-wave integrated circuit (MMIC) chip.

The variable gain amplifier 10 is preferably formed on a monolithic microwave integrated circuit (MMIC) chip 80 such as that shown in FIG. 9. The total chip size shown in FIG. 9 is approximately 500 μm by 350 μm, however, the circuit described herein can be reduced to an area as small as 350 μm by 350 μm. Accordingly, as much as 27,000 of these amplifier chips 80 may be formed on a single three inch GaAs wafer according to well known semiconductor technology. According to modern manufacturing cost, this translates into a compact low cost variable gain amplifier 10. In addition, while the present invention describes heterojunction bipolar transistors, it is conceivable that InP based amplifiers or silicon bipolar transistors may also be employed.

In view of the foregoing, it can be appreciated that the present invention enables the user to achieve a variable gain amplifier 10 with a wide dynamic range. Thus, while this invention has been disclosed herein in connection with a particular example thereof, no limitation is intended thereby except as defined by the following claims. This is because the skilled practitioner will recognize that other modifications can be made without departing from the spirit of this invention after studying the specification and drawings.

What is claimed is:

1. A bipolar variable gain amplifier comprising:
   an input for receiving an input signal;
   an output for providing an amplified output signal as a function of the input signal and a variable gain;
   a transistor amplifier including a first bipolar transistor having a base, a collector and an emitter, with the base connected to the input and the collector coupled to the output;
   a parallel feedback path connected between the collector and the base of said first transistor;
   a series feedback path connected to the emitter of said first transistor and having a variable resistance element;
   means for applying a variable control signal to the series feedback path to control the variable gain; and
   bias compensation means connected to the variable resistance element for generating a variable current so as to provide current bias to the variable resistance element.

2. The amplifier as defined in claim 1 wherein said variable resistance element comprises a first PIN diode.

3. The amplifier as defined in claim 2 wherein said bias compensation means includes a second PIN diode.

4. The amplifier as defined in claim 3 wherein said bias compensation means further includes a pair of transistors each having a base connected together and a collector of one of said pair of transistors coupled to the emitter of the first transistor, wherein said second PIN diode and said one of said pair of transistors form a path in parallel with the first PIN diode.

5. The amplifier as defined in claim 1 further comprising:
   buffer means including a buffer transistor having a base connected to the collector of the first transistor and an emitter coupled to the output.

6. The amplifier as defined in claim 5 further comprising a current source transistor having a collector connected to the emitter of said buffer transistor for providing bias thereto.

7. The amplifier as defined in claim 1 further comprising current mirror means coupled to the emitter of the first transistor for providing a fixed current mirror bias for said first transistor.

8. The amplifier as defined in claim 1 wherein said parallel feedback path comprises an emitter-follower transistor coupled to a feedback resistor.

9. The amplifier as defined in claim 1 wherein said amplifier is formed on a monolithic chip.

10. A monolithic bipolar variable gain amplifier with bias compensation comprising:
    a transistor amplifier including a first bipolar transistor having a base connected to an input for receiving an input signal, a collector coupled to an output, and said transistor further having an emitter;

a parallel feedback path connected between the collector and the base of said first transistor;

a series resistive feedback path connected between the emitter of the first transistor and a gain control source, said series feedback path including a variable resistance element for generating a variable resistance in response to a variable control signal;

bias compensation means connected to the variable resistance element for generating a variable current so as to provide current bias to the variable resistance element; and buffer means including a buffer transistor having a base connected to the collector of the first transistor and an emitter coupled to the output.

11. The amplifier as defined in claim 10 wherein said variable resistance element comprises a PIN diode.

12. The amplifier as defined in claim 11 wherein said bias compensation means includes a second PIN diode and at least one transistor connected in parallel with the first PIN diode so as to provide a parallel current path.

13. The amplifier as defined in claim 11 wherein said bias means comprises a current source transistor having a collector connected to the emitter of the buffer transistor for providing bias thereto.

14. The amplifier as defined in claim 10 further comprising bias means for biasing said buffer transistor.

15. The amplifier as defined in claim 10 further comprising current mirror means coupled to the emitter of the first transistor for providing a fixed current mirror bias for said first transistor.

16. A bipolar variable gain amplifier comprising:
an input for receiving an input signal;
an output for providing an amplified output signal as a function of the input signal and a variable gain;
a transistor amplifier including a first bipolar transistor having a base, a collector and an emitter, with the base connected to the input and the collector coupled to the output;
a parallel feedback path connected between the collector and the base of the first transistor;
a series feedback path connected to the emitter of the first transistor and having a variable resistance element;
means for applying a variable control signal to the series feedback path to control the variable gain; and
buffer means including a buffer transistor having a base connected to the collector of the first transistor and an emitter coupled to the output.

17. The amplifier as defined in claim 16 further comprising a current source transistor having a collector connected to the emitter of the buffer transistor for providing a bias thereto.

18. The amplifier as defined in claim 16 further comprising bias cmopensation means connected to the variable resistance element for generating a variable current source so as to provide current bias to the variable resistance element.

19. The amplifier as defined in claim 18 wherein said variable resistance element comprises a first PIN diode and said bias compensation means includes a second PIN diode in parallel with said first PIN diode.

20. The amplifier as defined in claim 19 wherein said bias compensation means further includes at least one transistor having a base connected to the second PIN diode and a collector connected to the emitter of the first bipolar transistor.

* * * * *